(12) United States Patent
Abdelli

(10) Patent No.: US 7,446,608 B2
(45) Date of Patent: Nov. 4, 2008

(54) VARIABLE GAIN AMPLIFIER WITH CONSTANT INPUT REFERRED THIRD ORDER INTERCEPT

(75) Inventor: Said E. Abdelli, Minneapolis, MN (US)

(73) Assignee: Honeywell Inernational Inc., Morristown, NJ (US)

( * ) Notice: Subject to any disclaimer, the term of this patent is extended or adjusted under 35 U.S.C. 154(b) by 0 days.

(21) Appl. No.: 11/355,673

(22) Filed: Feb. 16, 2006

(65) Prior Publication Data

US 2007/0188229 A1   Aug. 16, 2007

(51) Int. Cl.
*H03F 3/45* (2006.01)
(52) U.S. Cl. ...................... 330/254; 330/253
(58) Field of Classification Search .................. 330/253, 330/254, 257, 261
See application file for complete search history.

(56) References Cited

U.S. PATENT DOCUMENTS 6,710,659 B2 * 3/2004 Teramoto et al. ............ 330/254
6,771,124 B1 * 8/2004 Ezell .......................... 330/129
7,034,606 B2 * 4/2006 Caresosa et al. ............. 327/563
7,078,968 B2 * 7/2006 Gaeta et al. ................. 330/254

* cited by examiner

*Primary Examiner*—Henry K Choe
(74) *Attorney, Agent, or Firm*—McDonnell Boehnen Hulbert & Berghoff LLP

(57) ABSTRACT

Variable gain amplifier (VGA) circuits and methods implemented in such circuits are disclosed. An example VGA circuit includes a differential transistor pair for receiving a differential input signal. The differential transistor pair, in operation, conducts a substantially constant current over a linear operating range of the variable gain amplifier circuit. The VGA circuit also includes a current source that is coupled with the differential transistor pair. The current source, in operation, provides the substantially constant current to the differential transistor pair. The VGA circuit further includes a variable resistance circuit coupled with the differential transistor pair. In operation, a resistance of the variable resistance circuit is adjusted such that a gain of the variable gain amplifier circuit is adjusted. Further, in operation, the VGA circuit produces a differential output signal, the differential output signal being an amplified version of the differential input signal.

20 Claims, 6 Drawing Sheets

VARIABLE GAIN AMPLIFIER WITH CONSTANT INPUT REFERRED THIRD ORDER INTERCEPT

GOVERNMENT RIGHTS

The United States government may have certain rights in this invention pursuant to Contract No. F29601-03-3-0059, awarded by the U.S. Air Force.

BACKGROUND

1. Field

This disclosure relates to variable gain amplifier circuits.

2. Description of Related Art

Differential variable gain amplifiers (VGA) circuits are commonly used in a number of applications. As some examples, VGA circuits are used in automated test equipment, cellular system base stations and terrestrial links in satellite systems, among any number of other applications. In current embodiments of such VGA circuits, a gain of a specific VGA circuit (an amount of amplification of an applied input signal achieved) is controlled by varying the amount of current that flows through a differential pair of transistors that is included in the VGA. This current is referred to as Io, or "tail current." As the tail current is increased, the gain of the VGA circuit increases. Likewise, as the tail current is decreased, the gain of the VGA circuit decreases.

One important operating characteristic of such VGA circuits is linearity. Linearity is a measure of the variation of output signal strength in direct to proportion to input signal strength. A standard measure of the linearity of a VGA circuit is what is referred to as the third input intercept point (IIP3). The IIP3 of a VGA circuit is the output power amplitude at which the output of a fundamental input signal and the output power amplitude of a third harmonic of the fundamental input signal have equal magnitude. The greater the value of IIP3 is for a particular VGA circuit, the greater the linearity of that circuit is.

One drawback of current VGAs is that IIP3 varies as result of controlling the gain of the VGA. Specifically, as the tail current is varied to adjust the gain, IIP3 also varies. As with the gain of a VGA, the value of IIP3 for a given VGA circuit increases as the tail current (and gain) is increased and decreases as the tail current (and gain) is decreased. Such a relationship is undesirable as the linearity of the VGA will be reduced when the gain of the circuit is adjusted to operate at lower levels. This reduction in linearity reduces the range of amplitudes of input signals that the VGA is able to receive and reliably process. Therefore, alternative approaches for implementing VGA circuits are desirable.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are given by way of example and meant to be illustrative, not limiting in scope. In various embodiments, one or more of the above-described problems have been reduced or eliminated, while other embodiments are directed to other improvements.

Embodiments of variable gain amplifier (VGA) circuits (and methods of amplifying signals using such circuits) that address at least some of the drawbacks of prior approaches are disclosed. In such embodiments, a current source is used to provide a substantially constant current to a differential transistor pair of the VGA circuit. The gain is adjusted by varying the resistance of a variable resistance circuit that acts as a load resistance of the VGA circuit. Using such an approach, the gain of the VGA circuit can be varied while the input referred third order intercept point (IIP3) remains substantially constant. Therefore, such embodiments allow for adjusting the gain of a VGA circuit while maintaining substantially constant linearity.

An example of such a VGA circuit includes a differential transistor pair. In operation, the differential transistor pair receives a differential input signal. As discussed above, during operation of the VGA circuit, the differential transistor pair conducts a substantially constant current, which may be termed a "tail current." The tail current is substantially constant at least over a linear operating range of the VGA circuit;

The example VGA circuit further includes a current source that is coupled with the differential transistor pair. The current source provides the substantially constant current to the differential transistor pair. The current source may take any number of forms, such as a current mirror circuit that is biased by a cascoded bias generator.

The example VGA circuit additionally includes a variable resistance circuit (e.g., load resistance) that is coupled with the differential transistor pair. The gain of the VGA circuit is varied by varying a resistance of the variable resistance circuit. For instance, in order to establish a specific gain for such a VGA circuit, the resistance of the variable resistance circuit is set at a value that corresponds with the specific gain of the VGA circuit that is desired. Once a specific gain is established, the VGA circuit, in operation, produces a differential output signal, the differential output signal being an amplified version (at the established gain) of a differential input signal.

An example method for amplifying a differential signal using a VGA such as the example circuit described above includes providing a substantially constant current to a differential transistor pair. The substantially constant current, in this example, is provided by a current source that is coupled with the differential transistor pair. The example method further includes adjusting a gain of the variable gain amplifier by establishing a resistance of a variable resistance circuit that is coupled with (i) the differential transistor pair and (ii) a power supply terminal. The method still further includes communicating the differential input signal to the differential transistor pair and generating a differential output signal based on the differential input signal and the adjusted gain of the variable gain amplifier.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DETAILED DESCRIPTION

Embodiments of variable gain amplifier (VGA) circuits and methods that may be implemented by such circuits are shown and described generally herein. As was discussed above, such VGA circuits may be used in any number of applications. It will be appreciated that the particular circuit elements of a specific embodiment will depend, at least in part, on the particular application for which a specific VGA circuit is intended.

Variable Gain Amplifier

Figure 1:
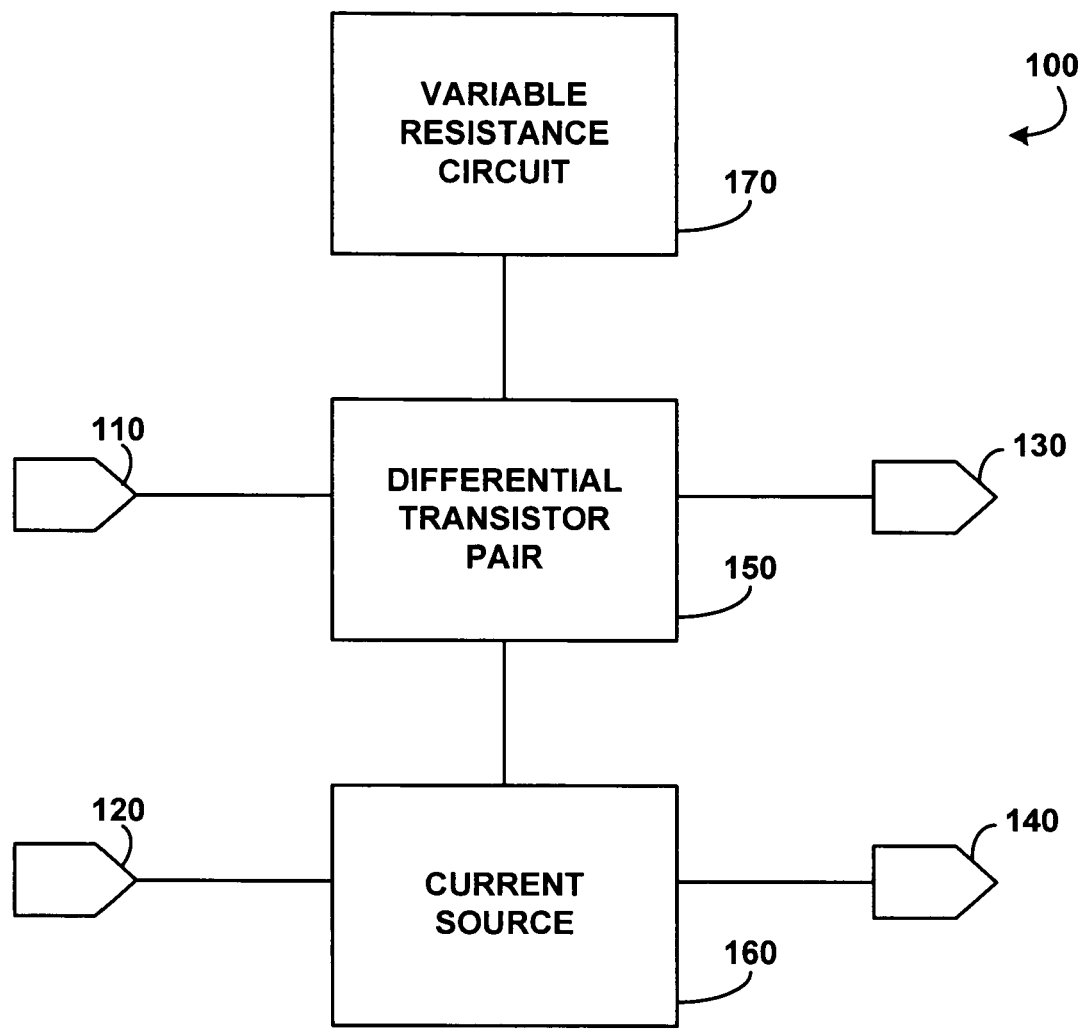
FIG. 1 is a block diagram of a variable gain amplifier circuit.

Referring to FIG. 1, a block diagram illustrating an example VGA circuit 100 is shown. The VGA circuit 100 has substantially constant linearity (e.g. a substantially constant input referred third intercept point (IIP3)) across a range of available gain settings for the VGA circuit 100. The VGA circuit 100 includes differential input signal terminals 110, 120 (e.g., a positive input signal terminal 110 and a negative input signal terminal 120) and differential output signal terminals 130,140 (e.g., a positive output signal terminal 130 and a negative output signal terminal 140). The input signal terminals 110,120 and output signal terminal 130,140 are coupled with a differential transistor pair 150.

The differential transistor pair 150 receives a differential input signal via the input signal terminals 110,120 and produces, in conjunction with the other elements of the VGA circuit 100, a differential output signal that is communicated (e.g., to other circuitry) via the output signal terminals 130, 140. The differential output signal of the VGA circuit 100 is an amplified version of the corresponding differential input signal, where an amount of amplification between the input signal and the output signal depends on the gain setting of the VGA circuit 100.

The VGA circuit 100 further includes a current source 160 that supplies a constant current to the differential transistor pair 150 for producing a differential output signal from a differential input signal. The current source 160 may take any number of forms, such as a constant current source or, alternatively, a variable current source that is used to provide a constant current to the differential transistor pair 150 during operation of the VGA circuit 100.

The VGA circuit 100 also includes a variable resistance circuit 170 that operates as a load resistance for the VGA circuit 100. The variable resistance circuit 170 is used to adjust the gain of the VGA circuit 100. Such gain adjustments are achieved as a result of changing the resistance of the variable resistance circuit 170. As is shown by the following equations, the VGA circuit 100 provides for adjusting the gain of the VGA circuit 100 while the linearity of the VGA circuit 100 remains substantially constant (e.g., as measured by the IIP3). For a given VGA circuit, such as a particular implementation of the VGA circuit 100, the values for gain and IIP3 are given by the following equations:

$$\text{Gain} = R_{load}\sqrt{\frac{k \cdot W}{L} \cdot I_o}$$

$$IIP3 = \sqrt{\frac{32 \cdot I_o}{3k \cdot \frac{W}{L}}}$$

In the above equations, 'k' is a transistor constant that is based on the design of the transistors used in the differential transistor pair 150, 'W' is the channel width of the transistors of the differential transistor pair 150 and 'L' is the channel length of the transistors of the differential transistor pair 150. Further, in the above equations, 'Io' is the current through the differential transistor pair 150, which may be termed the "tail current." It will be appreciated that the above equations are generally applicable for VGA circuits and, while the constants in the equations may change for a particular circuit, the general form of the equations would be the same.

As was discussed above, current VGA circuits achieve adjustments to the gain of the circuits by varying the tail current, Io. As is shown by the above equations, varying the tail current of a particular VGA circuit will result in the gain of a VGA circuit being proportionally varied. For instance, as the tail current is increased, the gain will increase. Likewise, as the tail current is decreased, gain will also decrease.

However, as is also shown by the above equations, as the tail current of a particular VGA circuit is varied, the linearity of that VGA circuit also varies. For instance, as with gain, as the tail current is increased, the value of IIP3 increases. Likewise, as the tail current is decreased, the value of IIP3 also decreases. As was discussed above, such variation in linearity as a result of varying the gain of a VGA circuit is undesirable. The VGA circuit 100 addresses at least this drawback of current approaches.

As is shown by the above equations, the gain of a particular VGA circuit, such as the VGA circuit 100, may also be varied by changing the value of the load resistance, Rload. From the gain equation shown above, increasing Rload (while keeping the tail current, Io, constant) will result in a corresponding increase in gain, while decreasing Rload (while keeping the tail current, Io, constant) will result in a corresponding decrease in gain. Further, from the IIP3 equation shown above, varying Rload (with a constant tail current) will result in the value of IIP3 remaining substantially constant.

Based on the foregoing, the gain of the VGA circuit 100 may be adjusted by varying the resistance of the variable resistance circuit 170. Increasing the resistance of the variable resistance circuit 170 will increase the gain of the VGA circuit 100, while decreasing the resistance of the variable resistance circuit 170 will decrease the gain of the VGA circuit 100. Further for the VGA circuit 100, by supplying the differential transistor pair 150 with a substantially constant current from the current source 160, varying the resistance of the variable resistance circuit 170 will not result in any substantial variation in the value of IIP3 for the VGA circuit 100. Therefore, the gain of the VGA circuit 100 may be varied while the linearity (e.g., as measured by the value of IIP3) remains substantially constant.

Figure 2:
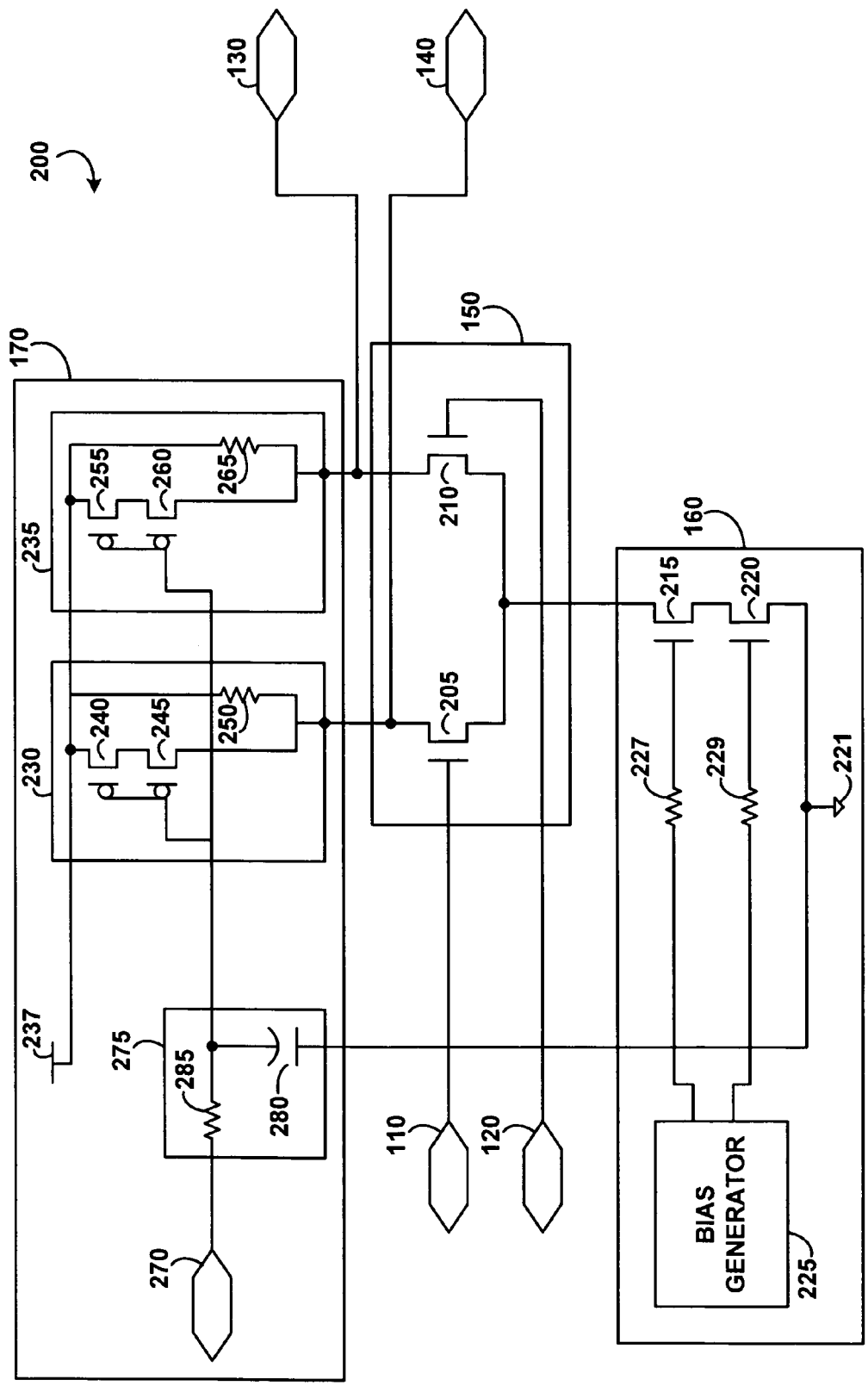
FIG. 2 is a schematic/block diagram illustrating a variable gain amplifier in further detail.

Referring now to FIG. 2, a schematic/block diagram illustrating, in more detail, an example VGA circuit 200 with substantially constant linearity is shown. In FIG. 2, like elements of the VGA circuit 200 with the VGA circuit 100 of FIG. 1 are referenced with the same reference numbers. Specifically, the VGA circuit 200 includes differential input signal terminals 110,120, differential output signal terminals 130,140, a differential transistor pair 150, a current source 160 and a variable resistance circuit 170. While FIG. 2 illustrates particular implementations for the differential transistor pair 150, the current source 160 and the variable resistance circuit 170, it will be appreciated that these elements of the VGA circuit 200 may be implemented in any number of ways.

As was discussed above with respect to the VGA circuit 100, for the VGA circuit 200, the differential transistor pair 150 receives a differential input signal via the input signal terminals 110,120. The differential input signal is amplified (to produce a differential output signal) by the differential transistor pair 150 in conjunction with the current source 160 and the variable resistance circuit 170. The differential transistor pair 150 conducts a substantially constant current over a linear operating range of the variable gain amplifier circuit 200, where the substantially constant current is supplied to the differential transistor pair by the current source 160 and the gain of the VGA circuit 200 is varied by adjusting the resistance of the variable resistance circuit 170. The differential output signal is communicated out of the VGA circuit 200 (e.g., to other circuitry) via the differential output signal terminals 130,140.

As shown in FIG. 2, the differential transistor pair 150 includes a first n-type field effect transistor (FET) 205 and a second n-type FET 210. The first n-type FET 205 and the second n-type FET 210 are coupled in a parallel configuration. Specifically, respective drain terminals of the first n-type FET 205 and the second n-type FET 210 are separately coupled with the variable resistance circuit 170. Further, respective source terminals of the first n-type FET 205 and the second n-type FET 210 are coupled with each other and further coupled with the current source 160. The current source 160 provides the substantially constant tail current to the differential transistor pair 150.

As was noted above, the current source 160 of the VGA circuit 200 could be implemented in any number of ways, such as a constant current source or a variable current source that is operated to provide a constant current (tail current) to the differential transistor pair 150. For the particular embodiment shown in FIG. 2, the current source 160 is implemented as a constant current source. For the VGA circuit 200, the current source 160 comprises a current mirror that includes a first n-type FET 215 and a second n-type FET 220. The first n-type FET 215 and the second n-type FET 220 are coupled in a stacked arrangement between the differential transistor pair 150 and an electrical ground terminal. Specifically, a drain terminal of the first n-type FET 215 is coupled with the source terminals of the transistors 205,210 of the differential transistor pair 150. Further, a source terminal of the first n-type FET 215 is coupled with a drain terminal of the second n-type FET 220 and a source terminal of the second n-type FET 220 is coupled with an electrical ground terminal 221.

The current source 160 further includes a bias generator 225 that provides voltage biases to gate terminals of the transistors 215,220 of the current mirror. The bias generator 225 may take any number of forms, such as a cascoded bias generator, an example of which is described below with respect to FIG. 3. Briefly, however, current reference signals may be supplied to the bias generator 225. These current reference signals are then mirrored by the current mirror (transistors 215,220) of the current source 160. The current source 160 still further includes resistors 227 and 229, which operate so as to reduce radio-frequency noise in the voltage bias signals provided by the bias generator 225.

It will be appreciated that the variable resistance circuits 170 of the VGA circuits 100 and 200 could be implemented in any number of ways. For instance, the variable resistance circuit 170 could be implemented as a "programmable" resistor array, where a resistance (or resistances) of the variable resistance circuit 170 is established by applying control signals to the resistor array to select a resistance (or resistances) that corresponds with a desired gain of the VGA circuit. Of course, numerous other possibilities exist.

For instance, for the VGA circuit 200, the variable resistance circuit 170 includes a first mixed resistance circuit 230 and a second mixed resistance circuit 235. As shown in FIG. 2, the first mixed resistance circuit 230 is coupled with (i) a power supply terminal 237 and (ii) the drain terminal of the first n-type FET 205 of the differential transistor pair 150. In similar fashion, the second mixed resistance circuit 235 is coupled with (i) the power supply terminal 237 and (ii) the drain terminal of the second n-type FET 210 of the differential transistor pair 150.

The variable resistance circuit 170 further includes a control signal terminal 270. In operation of the VGA circuit 200, a control signal (e.g., voltage signal) that is applied to the control signal terminal 270 establishes respective resistances of the first and second mixed resistance circuits 230,235, where the respective resistances correspond with a desired gain of the VGA circuit 200. For the particular embodiment illustrated in FIG. 2, the respective resistances of the first and second mixed resistance circuits 230,235 are substantially equal. This is desirable so that there is consistent amplification of the positive and negative components of differential signals being amplified by the VGA circuit 200.

To achieve substantially equal resistances for the first and second mixed resistance circuit 230 and 235, the arrangement of those circuits is substantially identical, as is shown in FIG. 2. For instance, the first mixed resistance circuit 230 includes a resistor 250 coupled between the power supply terminal 237 and the drain terminal of the first n-type FET 205 of the differential transistor pair 150. The first mixed resistance circuit 230 further includes a first p-type FET 240 and a second p-type FET 245. The first and second p-type FETs 240,245 are coupled in a stacked arrangement such that (i) a source terminal of the first p-type FET 240 is coupled with the power supply terminal 237, (ii) a drain terminal of the first p-type FET 240 is coupled with a source terminal of the second p-type FET 245 and (iii) a drain terminal of the second p-type FET 245 is coupled with the drain terminal of the first n-type FET 205 of the differential transistor pair 150.

In like fashion as the first mixed resistance circuit 230, the second mixed resistance circuit 235 includes a resistor 265 coupled between the power supply terminal 237 and the drain terminal of the second n-type FET 210 of the differential transistor pair 150. The second mixed resistance circuit 235 further includes a first p-type FET 255 and a second p-type FET 260. The first and second p-type FETs 255,260 are coupled in a stacked arrangement such that (i) a source terminal of the first p-type FET 255 is coupled with the power supply terminal 237, (ii) a drain terminal of the first p-type FET 255 is coupled with a source terminal of the second p-type FET 260 and (iii) a drain terminal of the second p-type FET 260 is coupled with the drain terminal of the second n-type FET 210 of the differential transistor pair 150.

The gain of the VGA circuit 200 is adjusted by varying the resistance of the first and second mixed resistance circuits 230 and 235. These resistances are varied by varying the voltage of a control signal applied to the control signal terminal 270. The gain will vary in accordance with the equation:

$$\text{Gain} = Rload \sqrt{\frac{k \cdot W}{L} \cdot Io}$$

This equation was also presented and described above. Therefore, the equation will not be discussed in detail again here. As the value of the voltage of a control signal applied to the control signal terminal 270 increases from approximately electrical ground up to the operating voltage of the VGA circuit 200 (e.g., the voltage applied to the power supply terminal 237), the resistance of the first and second mixed resistance circuits 230,235 will increase as well. As shown by the above equation, this increase in resistance of the first and second mixed resistance circuits 230,235 will result in a corresponding increase in gain for the VGA circuit 200. It will be appreciated that the resistance of the first and second mixed resistance circuits 230,235 will increase as the voltage of a control signal applied to the control signal terminal 270 is increased due to the operating characteristics of the p-channel FETs 240,245,255,260 of the first and second mixed resistance circuits 230,235 and the parallel arrangements of those transistors with the resistors 250,265.

The VGA circuit 200 further includes a low-pass filter 275 that is coupled with the control signal terminal 270. The low-pass filter 275 includes a capacitor 280 and a resistor 285. Such circuits are known and, therefore, will not be described in detail here. Briefly, however, the low pass filter 275 removes high-frequency signal components from the control signal applied to the control signal terminal 270. Because VGA circuits, such as the VGA circuit 200, are often used in radio frequency applications, high-frequency noise may be communicated onto the control signal terminal 270. Such high frequency noise may cause undesired variation in the resistance of the first and second mixed resistance circuits 230,235. The use of the low-pass filter 275 reduces the likelihood that such undesirable variation will occur.

Cascoded Bias Generator

Figure 3:
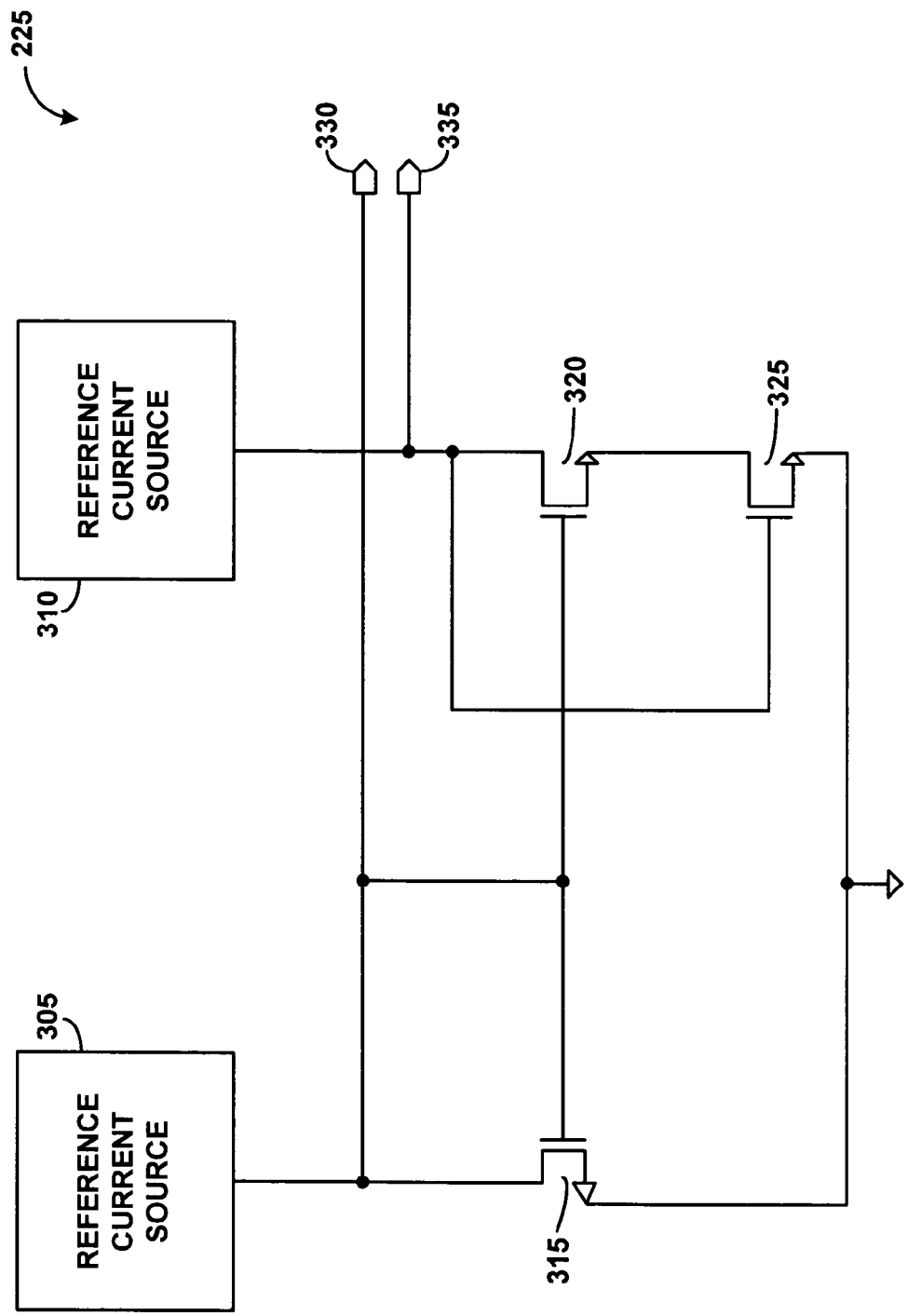
FIG. 3 is a schematic/block diagram of a cascoded bias generator circuit that may be implemented in the VGA circuits of FIGS. 1 and 2.

FIG. 3 illustrates a cascoded bias generator 300 that may be implemented as the bias generator 225 in the VGA circuit of FIG. 2 to provide voltage biases to drive the transistors 215, 220 of the current source 160, through the series resistors 217 and 222. The transistors 215,200 mirror current reference signals provided to the cascoded bias generator 300 by reference current sources 305,310. These voltage biases are communicated to the transistors 215,220 via, respectively output terminals 330,335 of the cascoded bias generator 300.

Such cascoded bias generator circuits are known. Therefore, for the purposes of brevity, the operation of such circuits will not be described in detail here. Briefly, however, the bias generator 300 includes n-type FETs 315, 320 and 325. The bias generator produces voltage biases from the reference currents provided by the current sources 305,310 using the n-type FETs 315, 320 and 325. These biases are communicated to the current source 160 of the circuit 200, which mirrors the currents provided by the reference current sources 305,310.

VGA Circuit Performance

Figure 4:
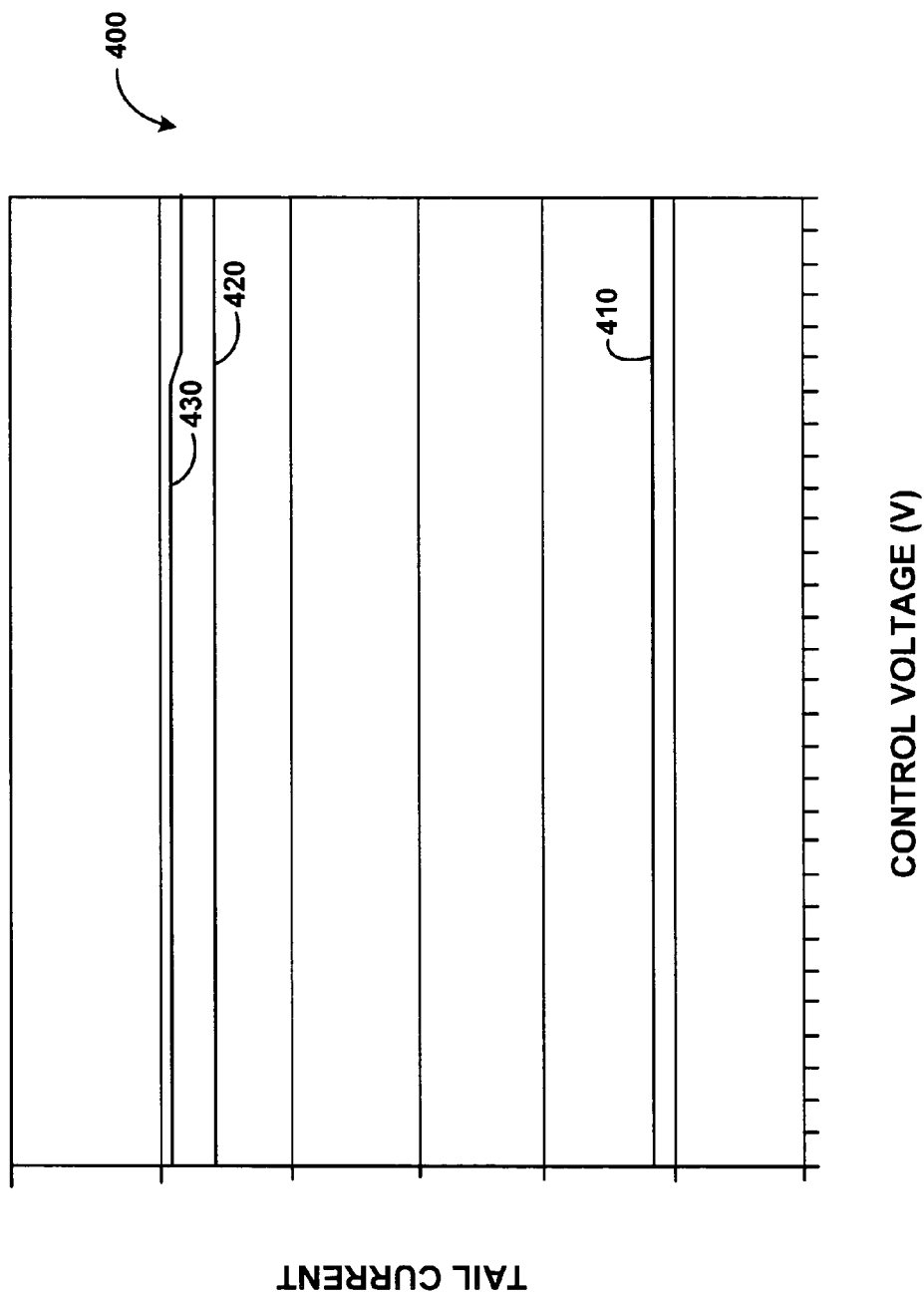
FIG. 4 is a graph illustrating tail current at various temperatures versus a variable resistance circuit control voltage for the variable gain amplifier shown in FIG. 2.
Figure 5:
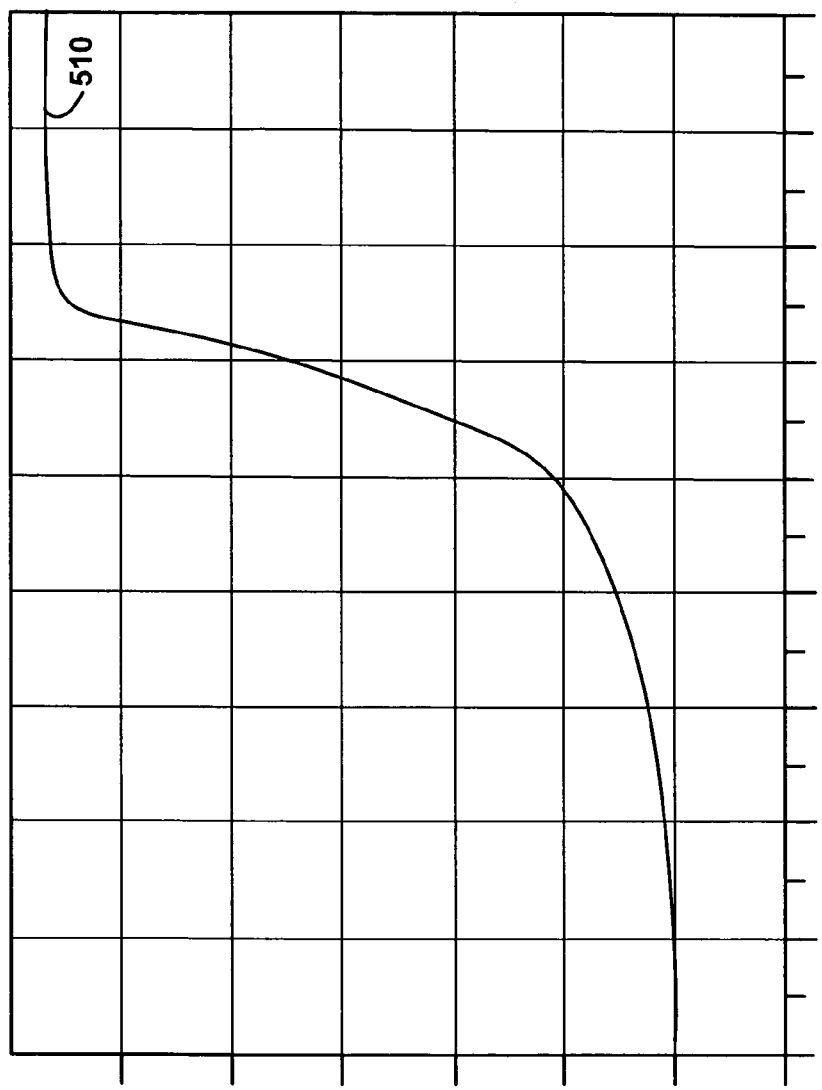
FIG. 5 is a graph illustrating gain versus a variable resistance circuit control voltage for the variable gain amplifier shown in FIG. 2.
Figure 6:
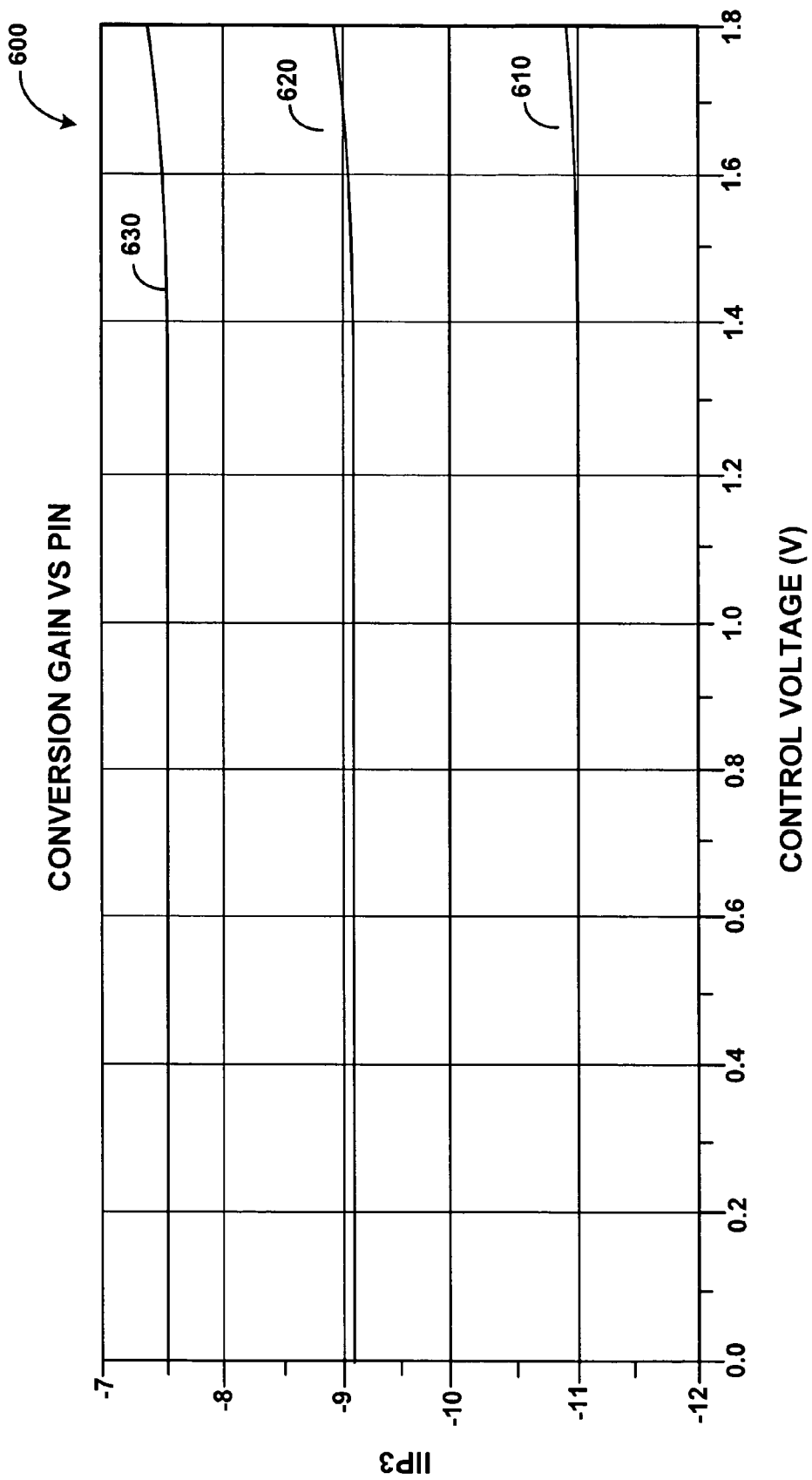
FIG. 6 is a graph illustrating IIP3 versus a variable resistance circuit control voltage for the variable gain amplifier shown in FIG. 2.

FIGS. 4, 5 and 6 illustrate circuit simulation results for an embodiment of the VGA circuit 200 shown in FIG. 2. FIG. 4 is a graph of tail current for the VGA circuit 200 at various operating temperatures. Tail current in FIG. 4 is plotted as a function of the control signal voltage applied to the control signal terminal 270 of the variable resistance circuit 170. FIG. 5 is a graph of the gain values of the VGA circuit 200 plotted as a function of the control signal voltage applied to the control signal terminal 270 of the variable resistance circuit 170. FIG. 6 is a graph of IIP3 values plotted as a function of the control signal voltage applied to the control signal terminal 270 of the variable resistance circuit 170.

FIG. 4 is a graph 400 that illustrates circuit simulation results for an embodiment of a VGA circuit in accordance with the VGA circuit 200 shown in FIG. 2. The graph 400 shows tail currents for the given VGA circuit at three operating temperatures. (e.g., −40° C., 30° C. and 100° C.) The tail currents are plotted as a function of the control signal voltage applied (across its operating range) to the variable resistance circuit (e.g., the variable resistance circuit 170) of the particular VGA circuit embodiment that was simulated.

In the graph 400, a first trace 410 illustrates the tail current of the VGA circuit at a first temperature (−40° C.), a second trace 420 illustrates the tail current of the VGA circuit at a second temperature 30° C. and a third trace 430 illustrates the tail current of the VGA circuit at a third temperature 100° C. As may be seen from the traces 410,420,430, tail current for the VGA circuit is substantially constant across the operating range of control voltages at the given various temperatures. For the trace 430, there is some very small variation in the tail current at higher control voltages (e.g., higher gains). This variation was, however, on the order of 5 na for a tail current of approximately 2.75 ma and is, therefore, statistically insignificant. This slight variation is due, in part, to the p-type FETs 240,245,255,260 of the variable resistance circuit 170 transitioning from operating in their linear region to pinch off and non-conduction. When the p-type FETs are non-conductive (e.g., off) the respective resistances of the mixed resistance circuits 230,235 are substantially equivalent with the values of the respective resistors 250,265. In this particular example, the respective resistances are substantially equal.

FIG. 5 is a graph 500 that illustrates the gain of the particular VGA circuit being simulated as a function of the control signal voltage applied (across its operating range) to the variable resistance circuit (e.g., the variable resistance circuit 170) of the particular VGA circuit embodiment simulated. As shown in FIG. 5, as the control signal voltage increases (and the resistance of the mixed resistance circuits 230,235 increase), the gain of the VGA circuit, as shown by a trace 510, increases until it reaches an upper limit and flattens out, as is typical for amplifier circuits. The gain to control voltage relationship shown by the trace 510 in FIG. 5 corresponds with the constant tail current illustrated in FIG. 4 by the trace 420. Therefore, an examination of FIG. 5 in conjunction with FIG. 4 demonstrates that the gain of the VGA circuit 200 can be varied by changing the resistance of the variable resistance while keeping the tail current through the differential transistor pair 150 substantially constant.

FIG. 6 is a graph 600 that illustrates the values of IIP3 as a function of the control signal voltage applied (across its operating range) to the variable resistance circuit for the particular VGA circuit that was simulated. As shown in FIG. 6 by traces 610, 620, 630 the value of IIP3 is substantially constant across the operating range of control voltages for the variable resistance circuit and also across temperature, with some slight variation at higher control voltages. As with the slight variation in tail current discussed above, this variation in IIP3 is due, in part, to the p-type FETs of the variable resistance circuit 170 transitioning from the linear region to non-conducting. The IIP3 values illustrated by the traces 610,620,630 correspond, respectively, with the with the constant tail currents illustrated in FIG. 4 by the traces 410,420,430. Thus, an examination of FIG. 6 in conjunction with FIGS. 4 and 5 demonstrates that linearity (as measured by IIP3) for the example embodiment of the VGA circuit 200 is substantially constant across a range of gain values, where the range of gain values are achieved by varying the resistances of the mixed resistance circuits 230,235 while maintaining a constant tail current in the differential transistor pair 150.

Conclusion

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

What is claimed is:

1. A variable gain amplifier circuit comprising:
    a differential transistor pair for receiving a differential input signal, the differential transistor pair, in operation, conducting a substantially constant current over a linear operating range of the variable gain amplifier circuit;
    a current source coupled with the differential transistor pair, the current source, in operation, providing the substantially constant current to the differential transistor pair;
    a variable resistance circuit directly coupled with the differential transistor pair, wherein, in operation, a resistance of the variable resistance circuit is adjusted while using the substantially constant current such that a gain of the variable gain amplifier circuit is adjusted,
    wherein, in operation, the variable gain amplifier circuit produces a differential output signal, the differential output signal being an amplified version of the differential input signal.

2. The variable gain amplifier circuit of claim 1, wherein the differential transistor pair comprises:
    a first n-type field effect transistor (FET); and
    a second n-type FET,
    wherein the first n-type FET and the second n-type FET are coupled in a parallel configuration such that:
        respective drain terminals of the first and second n-type FETs are coupled with the variable resistance circuit; and
        respective source terminals of the first and second n-type FETs are coupled with each other and further coupled with the current source.

3. The variable gain amplifier circuit of claim 2, further comprising:
    a first differential input signal terminal coupled with a gate of the first n-type FET;
    a second differential input signal terminal coupled with a gate of the second n-type FET;
    a first differential output signal terminal coupled with the drain terminal of the first n-type FET; and
    a second differential output signal terminal coupled with the drain terminal of the second n-type FET.

4. The variable gain amplifier circuit of claim 3, wherein the first differential input signal terminal is a positive input signal terminal, the second differential input signal terminal is a negative input signal terminal, the first differential output signal terminal is a negative output signal terminal and the second differential output signal terminal is a positive output signal terminal.

5. The variable gain amplifier circuit of claim 1, wherein the current source comprises a constant current source.

6. The variable gain amplifier circuit of claim 5, wherein the constant current source comprises:
    a current mirror, the current mirror including a first n-type field effect transistor (FET) and a second n-type FET coupled with the first n-type FET in a stacked arrangement between the differential transistor pair and an electrical ground terminal; and
    a cascoded bias generator circuit that is coupled with respective gate terminals of the first and second n-type FETs.

7. The variable gain amplifier circuit of claim 1, wherein the variable resistance circuit comprises:
    a first mixed resistance circuit, the first mixed resistance circuit being coupled with (i) a power supply terminal and (ii) a drain terminal of a first n-type field effect transistor (FET) of the differential transistor pair;
    a second mixed resistance circuit, the second mixed resistance circuit being coupled with (i) the power supply terminal and (ii) a drain terminal of a second n-type field effect transistor (FET) of the differential transistor pair; and
    a control signal terminal, wherein, in operation, a signal applied to the control signal terminal establishes respective resistances of the first and second mixed resistance circuits, the respective resistances corresponding with a desired gain of the variable gain amplifier circuit.

8. The variable gain amplifier circuit of claim 7, wherein the respective resistances of the first and second mixed resistance circuits are substantially equal.

9. The variable gain amplifier circuit of claim 7, further comprising a low-pass filter coupled with the control signal terminal, the low-pass filter, in operation, removing high-frequency signal components from the control signal.

10. The variable gain amplifier circuit of claim 7, wherein the first mixed resistance circuit comprises:
    a first resistor coupled between the power supply terminal and the drain terminal of the first n-type FET of the differential transistor pair;
    a first p-type FET; and
    a second p-type FET, the first and second p-type FETs being coupled in a stacked arrangement such that:
        a source terminal of the first p-type FET is coupled with the power supply terminal;
        a drain terminal of the first p-type FET is coupled with a source terminal of the second p-type FET; and
        a drain terminal of the second p-type FET is coupled with the drain terminal of the first n-type FET of the differential transistor pair.

11. The variable gain amplifier circuit of claim 10, wherein the second mixed resistance circuit comprises:
    a second resistor coupled between the power supply terminal and the drain terminal of the second n-type FET of the differential transistor pair;
    a third p-type FET; and
    a fourth p-type FET, the third and fourth p-type FETs being coupled in a stacked arrangement such that:
        a source terminal of the third p-type FET is coupled with the power supply terminal;
        a drain terminal of the third p-type FET is coupled with a source terminal of the fourth p-type FET; and
        a drain terminal of the fourth p-type FET is coupled with the drain terminal of the second n-type FET of the differential transistor pair.

12. A method for amplifying a differential input signal with a variable gain amplifier, the method comprising:
    providing a substantially constant current to a differential transistor pair, wherein the substantially constant current is provided by a current source that is coupled with the differential transistor pair;

adjusting a gain of the variable gain amplifier while using the substantially constant current, wherein the gain is adjusted by establishing a resistance of a variable resistance circuit that is coupled directly with (i) the differential transistor pair and (ii) a power supply terminal;

communicating the differential input signal to the differential transistor pair; and generating a differential output signal based on the differential input signal and the adjusted gain of the variable gain amplifier.

13. The method of claim 12, wherein providing the substantially constant current comprises providing a cascoded voltage bias to a current mirror.

14. The method of claim 12, wherein establishing the resistance of the variable resistance circuit comprises:

providing a first resistance, wherein the first resistance comprises a fixed resistance; and providing a second resistance by applying a control signal to the variable resistance circuit to establish the second resistance, wherein the second resistance comprises a variable resistance coupled in parallel with the first resistance.

15. The method of claim 14, wherein applying a control signal to the variable resistance circuit comprises applying a voltage signal to respective gate terminals of a first p-type field effect transistor (FET) and a second p-type FET, wherein the first and second p-type FETs are coupled in a stacked arrangement in parallel with the first resistance.

16. The method of claim 14, further comprising filtering the control signal to remove high-frequency signal components.

17. A variable gain amplifier circuit comprising:

a differential transistor pair for receiving a differential input signal, the differential transistor pair, in operation, conducting a substantially constant current over a linear operating range of the variable gain amplifier circuit;

a constant current source coupled with the differential transistor pair, the constant current source, in operation, providing the substantially constant current to the differential transistor pair;

a variable resistance circuit coupled directly with the differential transistor pair, wherein, in operation, a resistance of the variable resistance circuit is adjusted while using the substantially constant current such that a gain of the variable gain amplifier circuit is adjusted, the variable resistance circuit including:

a first mixed resistance circuit, the first mixed resistance circuit being coupled with (i) a power supply terminal and (ii) a drain terminal of a first n-type field effect transistor (FET) of the differential transistor pair;

a second mixed resistance circuit, the second mixed resistance circuit being coupled with (i) the power supply terminal and (ii) a drain terminal of a second n-type field effect transistor (FET) of the differential transistor pair; and a control signal terminal, wherein, in operation, a signal applied to the control signal terminal establishes respective resistances of the first and second mixed resistance circuits, the respective resistances corresponding with a desired gain of the variable gain amplifier circuit, wherein, in operation, the variable gain amplifier circuit produces a differential output signal, the differential output signal being an amplified version of the differential input signal.

18. The variable gain amplifier circuit of claim 17, wherein the constant current source comprises:

a current mirror, the current mirror comprising a first n-type field effect transistor (FET) and a second n-type FET coupled with the first n-type FET in a stacked arrangement between the differential transistor pair and an electrical ground terminal; and a cascoded bias generator circuit that is coupled with respective gate terminals of the first and second n-type FETs.

19. The variable gain amplifier circuit of claim 17, wherein the first mixed resistance circuit comprises:

a resistor coupled between the power supply terminal and the drain terminal of the first n-type FET of the differential transistor pair;

a first p-type FET; and a second p-type FET, the first and second p-type FETs being coupled in a stacked arrangement such that:

a source terminal of the first p-type FET is coupled with the power supply terminal;

a drain terminal of the first p-type FET is coupled with a source terminal of the second p-type FET; and a drain terminal of the second p-type FET is coupled with the drain terminal of the first n-type FET of the differential transistor pair.

20. The variable gain amplifier circuit of claim 17, wherein the second mixed resistance circuit comprises:

a resistor coupled between the power supply terminal and the drain terminal of the second n- type FET of the differential transistor pair;

a first p-type FET; and a second p-type FET, the first and second p-type FETs being coupled in a stacked arrangement such that:

a source terminal of the first p-type FET is coupled with the power supply terminal;

a drain terminal of the first p-type FET is coupled with a source terminal of the second p-type FET; and a drain terminal of the second p-type FET is coupled with the drain terminal of the first n-type FET of the differential transistor pair.

* * * * *